(12) United States Patent
Moon et al.

(10) Patent No.: US 7,498,841 B2
(45) Date of Patent: Mar. 3, 2009

(54) LEVEL SHIFTER AND DISPLAY DEVICE INCLUDING THE SAME

(75) Inventors: Kook Chul Moon, Yongin-si (KR); Soong-Yong Joo, Seongnam-si (KR); Ho-Suk Maeng, Seoul (KR); Seong-Il Park, Seoul (KR); Cheol-Min Kim, Seoul (KR); Tae-Hyeong Park, Yongin-si (KR); Il-Gon Kim, Seoul (KR); Chul-Ho Kim, Seoul (KR); Kee-Chan Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 264 days.

(21) Appl. No.: 11/298,338

(22) Filed: Dec. 8, 2005

(65) Prior Publication Data

US 2006/0125811 A1    Jun. 15, 2006

(30) Foreign Application Priority Data

Dec. 13, 2004    (KR)    ............... 10-2004-0104935

(51) Int. Cl.
*H03K 19/0175*    (2006.01)
(52) U.S. Cl. ......................................... 326/81; 326/68

(58) Field of Classification Search .................. 326/80, 326/81, 63, 68
See application file for complete search history.

(56) References Cited

U.S. PATENT DOCUMENTS

| 6,734,700 | B2 * | 5/2004 | Chiu et al. ................. 326/27 |
| 6,741,230 | B2 | 5/2004 | Sakai et al. |
| 6,756,635 | B2 | 6/2004 | Yasuda et al. |
| 2005/0040853 | A1 * | 2/2005 | Mentze et al. ............... 326/81 |

FOREIGN PATENT DOCUMENTS

| JP | 05308274 | 11/1993 |
| JP | 10096958 | 4/1998 |
| JP | 2000058671 | 2/2000 |
| KR | 1019980033303 | 7/1998 |
| KR | 1019980050387 | 9/1998 |
| KR | 1020040042343 | 5/2004 |

\* cited by examiner

*Primary Examiner*—James H Cho
(74) *Attorney, Agent, or Firm*—Cantor Colburn LLP (57) ABSTRACT

A level shifter includes: a voltage dividing unit receiving a first voltage and an input voltage, and generating a middle voltage between the first voltage and the input voltage; first and second voltage compensating units connected to the voltage dividing unit and connected between the first voltage and a second voltage, for compensating a voltage variation of the voltage dividing unit; and an output unit receiving an output from the voltage dividing unit and generating an output voltage.

21 Claims, 6 Drawing Sheets

LEVEL SHIFTER AND DISPLAY DEVICE INCLUDING THE SAME

This application claims priority to Korean Patent Application No. 10-2004-0104935, filed on Dec. 13, 2004 and all the benefits accruing therefrom under 35 U.S.C. §119, and the contents of which in their entirety are herein incorporated by reference.

BACKGROUND OF THE INVENTION (a) Field of the Invention

The present invention relates to a level shifter and a display device including the same.

(b) Description of Related Art

Recently, flat panel display devices such as organic light emitting diode ("OLED") display devices, plasma display panel ("PDP") devices, and liquid crystal display ("LCD") devices have been widely developed.

The PDP devices display characters or images using plasma generated by a gas-discharge. The OLED display devices display characters or images by applying an electric field to specific light-emitting organics or high molecule materials. The LCD devices display images by applying an electric field to a liquid crystal layer disposed between two panels and regulating the strength of the electric field to adjust a transmittance of light passing through the liquid crystal layer.

Among the flat panel display devices, as examples, the LCD and the OLED devices each includes a panel assembly provided with pixels including switching elements and display signal lines. The LCD and OLED device also include a gate driver providing a gate signal for gate lines of the display signal lines to turn on/off the switching elements, a data driver that provides a data signal for data lines of the display signal lines to apply a data voltage to the pixel via the turned-on switching elements, and a signal controller controlling the above-described elements, and further includes a level shifter amplifying a predetermined logic signal from the signal controller or an external device to provide an amplified signal to the gate and the data drivers.

The level shifter includes a plurality of transistors, which may be comprised of amorphous silicon. The transistors are sensitive to variation of characteristics including, but not limited to, a threshold voltage. This variation makes it hard to manufacture the level shifter including the transistors. Additionally, when the absolute value of the threshold voltage becomes too large, the transistors will not turned on and may cause a malfunction.

BRIEF SUMMARY OF THE INVENTION

An object of the present invention is to provide a level shifter and a display device including the same that is capable of alleviating such conventional problems.

A level shifter is provided, which includes: a voltage dividing unit receiving a first voltage and an input voltage and generating a middle voltage of the first voltage and the input voltage; first and second voltage compensating units connected to the voltage dividing unit and connected between the first voltage and a second voltage, compensating a voltage variation of the voltage dividing unit; and an output unit receiving an output from the voltage dividing unit and outputting an output voltage.

The voltage dividing unit may include: a first transistor having a first terminal connected to the first voltage, a second terminal connected to the second voltage compensating unit, and a third terminal connected to a first contact connected to the output unit; and a second transistor having a first terminal connected to the first contact, a second terminal connected to the first voltage compensating unit, and a third terminal connected to the input voltage.

The first voltage compensating unit may include: a third transistor having a first terminal connected to the first voltage, a second terminal connected to the second voltage, and a third terminal connected to a second contact connected to the second terminal of the second transistor; and a fourth transistor having first and second terminals commonly connected to the second contact, and a third terminal connected to the second voltage.

The second voltage compensating unit may include: a fifth transistor having a first terminal connected to the first voltage, and second and third terminals commonly connected to a third contact connected to the second terminal of the first transistor; and a sixth transistor having a first terminal connected to the third contact, a second terminal connected to the first voltage, and a third terminal connected to the second voltage.

The output unit may include first and second inverters connected in series between the first contact and an output terminal outputting the output voltage.

The third transistor may operate in an ohmic state and the fourth transistor may operate in a saturation state.

The fifth transistor may operate in a saturation state and the sixth transistor may operate in an ohmic state.

When threshold voltages of the first and the second transistors are varied, the first and the second voltage compensating units may vary voltages at the second terminals of the first and the second transistors by as much as variation amounts of the threshold voltages, respectively.

The first voltage may be a power supply voltage and the second voltage may be a ground voltage.

The first to the sixth transistors may contain low temperature poly-silicon.

The first, the third, and the fifth transistors may be PMOS types, and the second, the fourth, and the sixth transistors may be NMOS types.

A display device includes a level shifter amplifying a predetermined voltage for output, a gate driver and a data driver operating on the basis of the output from the level shifter, and a signal controller controlling the gate driver and the data driver, wherein the level shifter includes: a voltage dividing unit receiving a first voltage and an input voltage and generating a middle voltage of the first voltage and the input voltage; first and second voltage compensating units connected to the voltage dividing unit and connected between the first voltage and a second voltage, for compensating a voltage variation of the voltage dividing unit; and an output unit receiving an output from the voltage dividing unit and outputting an output voltage.

The level shifter may be integrated in the display device.

BRIEF DESCRIPTION OF THE DRAWINGS

The present invention will become more apparent by describing exemplary embodiments thereof in detail with reference to the accompanying drawings, in which.

DETAILED DESCRIPTION OF THE INVENTION

The present invention will be described more fully hereinafter with reference to the accompanying drawings, in which exemplary embodiments of the invention are shown. This invention may, however, be embodied in many different forms and should not be construed as limited to the exemplary embodiments set forth herein.

In the drawings, the thickness of layers and regions have been exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

A level shifter and a display device including the same according to exemplary embodiments of the present invention will be now described with reference to the drawings.

Figure 1:
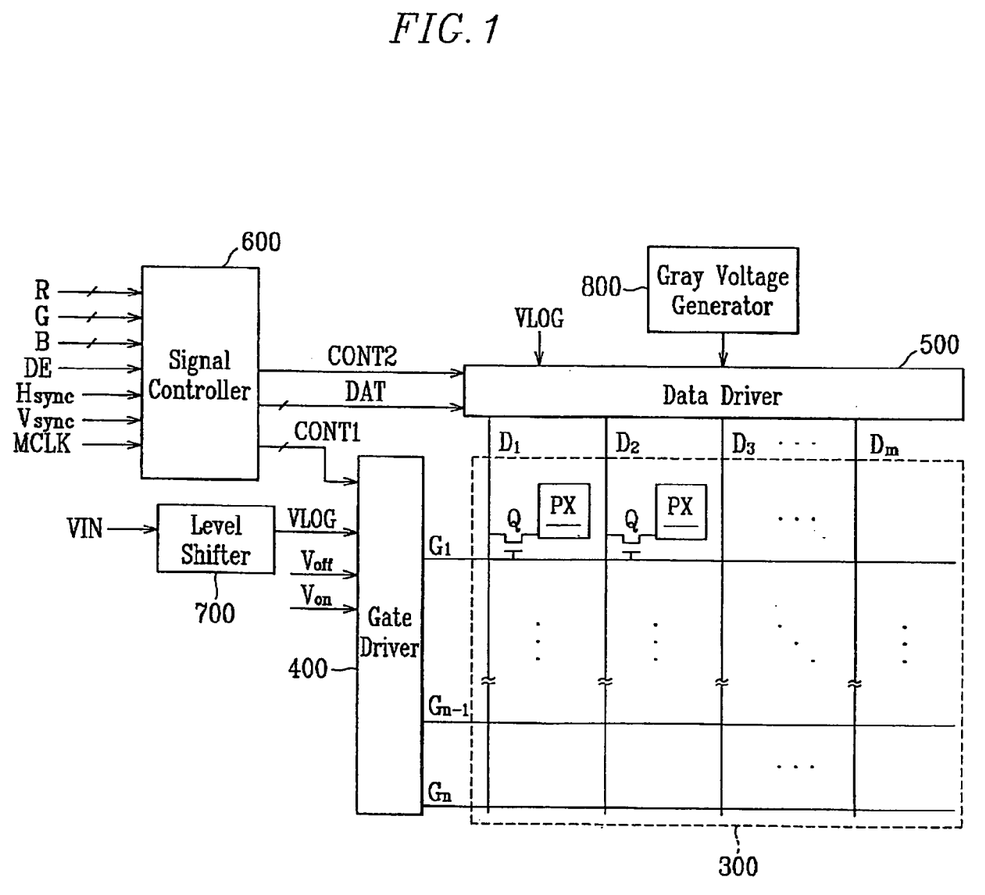
FIG. 1 is a block diagram of an exemplary embodiment of a display device according to the present invention.
Figure 2:
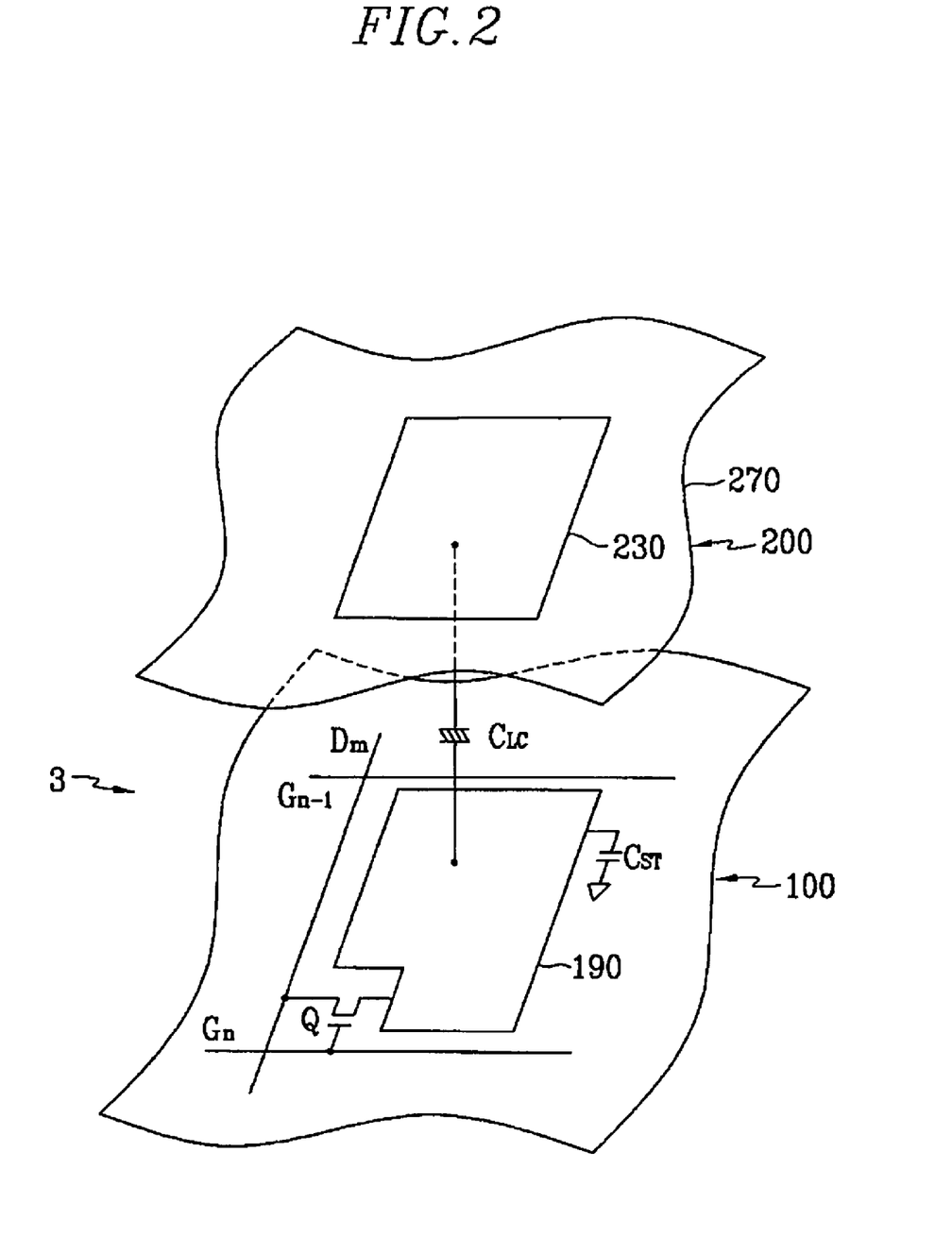
FIG. 2 illustrates a structure and an equivalent circuit diagram of an exemplary embodiment of a pixel of a liquid crystal display (LCD) according to the present invention.
Figure 3:
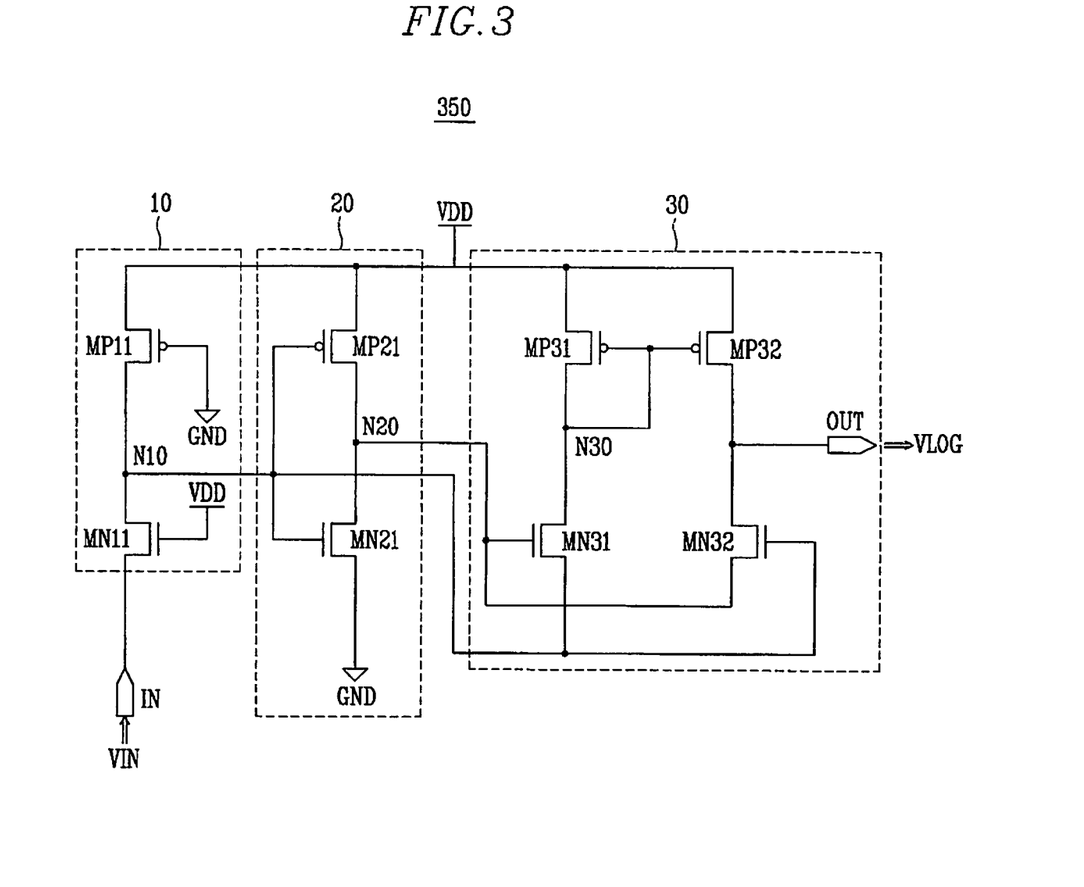
FIG. 3 is a circuit diagram of an exemplary embodiment of a level shifter according to the present invention.

FIG. 1 is a block diagram of an embodiment of a display device according to the present invention, FIG. 2 illustrates a structure and an equivalent circuit diagram of an exemplary embodiment of a pixel of an LCD according to the present invention, and FIG. 3 is a schematic view of an exemplary embodiment of a display device according to the present invention.

Referring to FIG. 1 and FIG. 2, a display device according to an exemplary embodiment of the present invention includes a panel assembly 300, a gate driver 400 and a data driver 500 connected thereto. The display device also includes a gray voltage generator 800 connected to the data driver 500, a level shifter 700 providing a predetermined amplified voltage to the gate driver 400 and the data driver 500, and a signal controller 600 that controls the above-described elements.

The panel assembly 300 includes a plurality of display signal lines $G_1$-$G_n$ and $D_1$-$D_m$, and a plurality of pixels connected to the display signal lines $G_1$-$G_n$ and $D_1$-$D_m$. The pixels may be arranged substantially in a matrix structure. The panel assembly 300 includes a lower panel 100 and an upper panel 200.

The display signal lines $G_1$-$G_n$ and $D_1$-$D_m$ are provided on the lower panel 100, and include gate lines $G_1$-$G_n$, which transmit gate signals (also referred to as scanning signals) and data lines $D_1$-$D_m$, which transmit data signals. The gate lines $G_1$-$G_n$ extend substantially in a row direction and are substantially parallel to each other, while the data lines $D_1$-$D_m$ extend substantially in a column direction and are substantially parallel to each other.

Each pixel includes a switching element Q connected to one of the gate lines $G_1$-$G_n$ and one of the data lines $D_1$-$D_m$, and a pixel circuit PX connected to the switching element Q. The switching element Q is provided on the lower panel 100 and includes three terminals: a control terminal connected to one of the gate lines $G_1$-$G_n$; an input terminal connected to one of the data lines $D_1$-$D_m$; and an output terminal connected to the pixel circuit PX.

In active matrix LCD devices, which are an example of a flat panel display device, the panel assembly 300 includes the lower panel 100, the upper panel 200, and a liquid crystal (LC) layer 3 disposed between the lower and upper panels 100 and 200. Additionally, the display signal lines $G_1$-$G_n$ and $D_1$-$D_m$ and the switching elements Q are provided on the lower panel 100. Each pixel circuit PX includes an LC capacitor $C_{LC}$ and a storage capacitor $C_{ST}$ that are connected in parallel with the switching element Q. In alternative embodiments, the storage capacitor $C_{ST}$ may be omitted if the storage capacitor $C_{ST}$ is not needed.

The LC capacitor $C_{LC}$ includes a pixel electrode 190 on the lower panel 100, a common electrode 270 on the upper panel 200, and the LC layer 3 as a dielectric between the pixel and common electrodes 190 and 270. The pixel electrode 190 is connected to the switching element Q, and the common electrode 270 may cover the entire surface of the upper panel 200 and be supplied with a common voltage. In an alternative exemplary embodiment, both the pixel electrode 190 and the common electrode 270 may be in the shape of bars or stripes or the like and may be provided on the lower panel 100.

The storage capacitor $C_{ST}$ is an auxiliary capacitor for the LC capacitor $C_{LC}$. The storage capacitor $C_{ST}$ includes the pixel electrode 190 and a separate signal line (not shown), which is provided on the lower panel 100 and overlaps the pixel electrode 190. An insulator may be disposed between the pixel electrode 190 and the separate signal line. The storage capacitor $C_{ST}$ is supplied with a predetermined voltage such as the common voltage. The storage capacitor $C_{ST}$ includes the pixel electrode 190 and an adjacent gate line referred to as a previous gate line, which overlaps the pixel electrode 190 with an insulator disposed between the pixel electrode 190 and the previous gate line.

In an embodiment, for a color display, each pixel may uniquely represent one of three primary colors such as red, green, and blue colors, referred to as spatial division. In another embodiment, each pixel may sequentially represent the three primary colors in time, referred to as temporal division. FIG. 2 shows an exemplary embodiment of spatial division in which each pixel includes a color filter 230 representing one of the three primary colors in an area of the upper panel 200 facing the pixel electrode 190. In alternative embodiments, the color filter 230 may be provided on or under the pixel electrode 190 on the lower panel 100.

In an exemplary embodiment, a pair of polarizers (not shown) for polarizing light are attached on outer surfaces of the lower and upper panels 100 and 200 of the panel assembly 300.

Referring back to FIG. 1, a gray voltage generator 800 generates one set or two sets of gray voltages that are related to transmittance of the pixels. When two sets of the gray voltages are generated, one set of the gray voltages may have a positive polarity with respect to the common voltage, while the other set of the gray voltages may have a negative polarity with respect to the common voltage. When one set of gray voltages are generated, the gray voltages may have either a positive polarity or a negative polarity with respect to the common voltage.

The gate driver 400 is connected to the gate lines $G_1$-$G_n$ of the panel assembly 300, and it synthesizes the gate-on voltage Von and the gate-off voltage Voff from an external device to generate gate signals for application to the gate lines $G_1$-$G_n$. The gate driver 400 may be a shifter register that includes a plurality of stages in a line. The gate driver 400 may be integrated on the panel assembly 300 or may be a discrete device connected to the panel assembly 300.

The data driver 500 is connected to the data lines $D_1$-$D_m$ of the panel assembly 300 and applies data voltages, which are selected from the gray voltages supplied from the gray voltage generator 800, to the data lines $D_1$-$D_m$. The data driver 500 may be integrated on the panel assembly 300 or may be a discrete device connected to the panel assembly 300.

The level shifter 700 converts a predetermined logic voltage VIN from the signal controller 600 or an external device to an amplified logic voltage VLOG and transmits the VLOG to the gate driver 400 and the data driver 500. The level shifter 700 may be integrated on the panel assembly 300 or may be a discrete device connected to the panel assembly 300.

The signal controller 600 controls the gate driver 400 and the data driver 500. The signal controller 600 may be integrated on the panel assembly 300 or may be a discrete device connected to the panel assembly 300.

Now, the operation of the display device will be described in detail referring to FIG. 1.

The signal controller 600 is supplied with image signals R, G, and B and input control signals for controlling the display of the image signals R, G, and B. The input control signals include, but are not limited to, a vertical synchronization signal Vsync, a horizontal synchronization signal Hsync, a main clock MCLK, and a data enable signal DE. The input control signals may be received from an external graphic controller (not shown). The signal controller 600 generates gate control signals CONT1 and data control signals CONT2 and processes the image signals R, G, and B to be suitable for the operation of the panel assembly 300 in response to the input control signals. In addition, the signal controller 600 transmits the gate control signals CONT1 to the gate driver 400, and the processed image signals DAT and the data control signals CONT2 to the data driver 500.

The gate control signals CONT1 may include, but are not limited to, a vertical synchronization start signal STV for informing the gate driver of a start of a frame, a gate clock signal CPV for controlling an output time of the gate-on voltage Von, and an output enable signal OE for defining a width of the gate-on voltage Von.

The data control signals CONT2 may include, but are not limited to, a horizontal synchronization start signal STH for informing the data driver 500 of a start of a horizontal period, a load signal LOAD or TP for instructing the data driver 500 to apply the appropriate data voltages to the data lines $D_1$-$D_m$, and a data clock signal HCLK. The data control signals CONT2 may also include an inversion control signal RVS for reversing the polarity of the data voltages (with respect to the common voltage).

The data driver 500 receives the processed image signals DAT for a pixel row from the signal controller 600 and converts the processed image signals DAT into analog data voltages. The analog data voltages may be selected from the gray voltages supplied from the gray voltage generator 800 in response to the data control signals CONT2 from the signal controller 600.

In response to the gate control signals CONT1 from the signal controller 600, the gate driver 400 applies the gate-on voltage Von to the gate lines $G_1$-$G_n$, thereby turning on the switching elements Q connected to the gate lines $G_1$-$G_n$.

The data driver 500 may apply the data voltages to corresponding data lines $D_1$-$D_m$ for a turn-on time of the switching elements Q (which is referred to as "one horizontal period" or "1H" and equals to one period of the horizontal synchronization signal Hsync, the data enable signal DE, and the gate clock signal CPV). The data voltages in turn are supplied to corresponding pixels via the turned-on switching elements Q.

The difference between the data voltage and the common voltage applied to a pixel is expressed as a charged voltage of the LC capacitor $C_{LC}$, i.e., a pixel voltage. The orientation of the liquid crystal molecules depend on a magnitude of the pixel voltage and the orientations of the liquid crystal molecules determine a polarization of light passing through the LC capacitor $C_{LC}$. The polarizers convert light polarization into light transmittance.

By repeating the above-described procedure, all gate lines $G_1$-$G_n$ are sequentially supplied with the gate-on voltage Von during a frame, thereby applying the data voltages to all pixels. In the case of the LCD shown in FIG. 1, when a next frame starts after finishing one frame, the inversion control signal RVS applied to the data driver 500 is controlled such that a polarity of the data voltages is reversed ("frame inversion"). The inversion control signal RVS may be controlled such that the polarity of the data voltages flowing in a data line in one frame is reversed (e.g.: "row inversion", "dot inversion"), or the polarity of the data voltages in one packet is reversed (e.g.: "column inversion", "dot inversion").

A level shifter according to embodiments of the present invention will now be described in detail with reference to FIGS. 3-7.

Figure 4A:
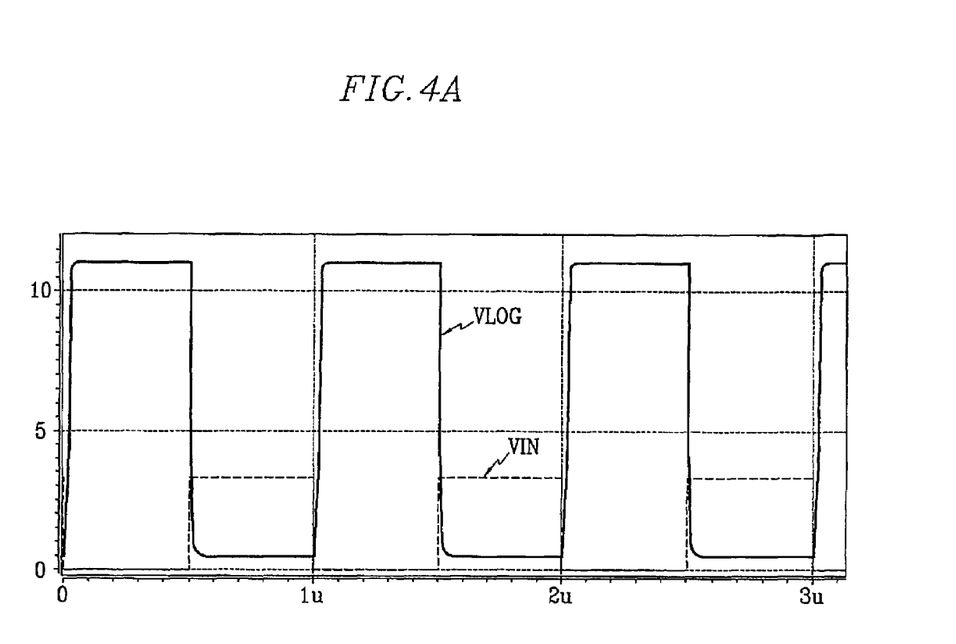
FIGS. 4A and 4B show signal waveforms of the level shifter shown in FIG. 3.
Figure 4B:
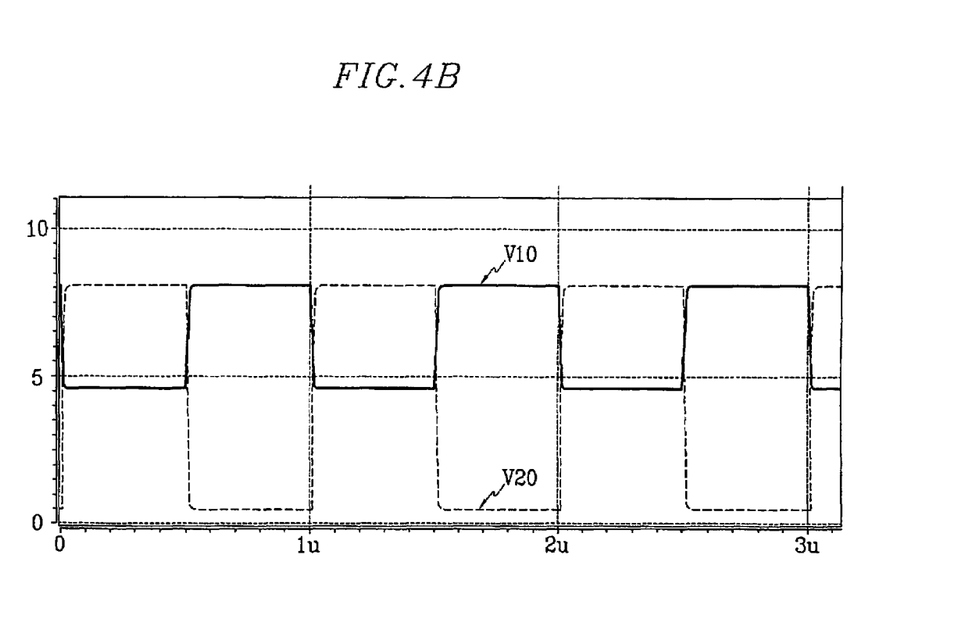

FIG. 3 is a circuit diagram of a level shifter according to an exemplary embodiment of the present invention, and FIGS. 4A and 4B show signal waveforms of the level shifter shown in FIG. 3.

Referring to FIG. 3, a level shifter 350 according to an exemplary embodiment of the present invention includes a voltage dividing unit 10, an inverting unit 20, and an output unit 30.

In an exemplary embodiment, the voltage dividing unit 10 includes transistors MP11 and MN11 connected between a power supply voltage VDD and an input voltage VIN. The transistor MP11 is a PMOS type and a gate thereof is connected to a ground voltage, transistor MN11 is an NMOS type and a gate thereof is connected to the power supply voltage VDD, and drains of the two transistors MP11 and MN11 are connected to a point of contact N10. However, it is also contemplated that the voltage dividing unit 10 may be any other suitable circuit for dividing a voltage.

In an exemplary embodiment, the inverting unit 20 includes transistors MP21 and MN21 connected between the power supply voltage VDD and the ground voltage GND. The transistor MP21 is a PMOS type and the transistor MN21 is an NMOS type, and gates of the two transistors MP21 and MN21 are connected to the contact N10 and drains thereof are connected to a point of contact N20. However, it is also contemplated that the inverting unit 20 may be any other suitable circuit for inverting a voltage.

The output unit 30 includes transistors MP31 and MP32 respectively connected between the power supply voltage VDD, a point of contact N30 and an output terminal OUT. The output unit 30 includes a transistor MN31 connected between the contact N30 and the contact N10 and a transistor MN32 connected between the output terminal OUT and the contact N20. However, it is also contemplated that the output unit 30 may be any other suitable circuit for outputting a voltage.

The voltage dividing unit 10 provides a middle voltage of the power supply voltage VDD and the input voltage VIN, the inverting unit 20 receives the middle voltage to provide an inverting voltage for the middle voltage, and the output unit 30 compares magnitudes of the middle voltage and the inverting voltage of the middle voltage to output the power supply voltage VDD or the ground voltage GND depending on a result thereof.

The voltage dividing unit 10 outputs a voltage determined by resistances at the time of turning-on of two transistors MP11 and MN11 to the contact N10. In an exemplary embodiment, when the input voltage VIN having a low value is input, the voltage dividing unit 10 outputs a low voltage that is capable of turning on the transistor MP21, and, when the input voltage VIN having a high value is input, it outputs a high voltage that is capable of turning on the transistor MN21.

In FIG. 4A, when the input voltage VIN having the low voltage, for example 0V, is inputted, a voltage V10 at the contact N10 is 4.5V which is shown as an example of the low voltage, and when the input voltage VIN having the high voltage, for example 3.3V, is inputted, the voltage V10 is 8V which is shown as an example of the high voltage.

The inverting unit 20 receives a middle voltage of the high voltage and the low voltage and outputs the inverted voltage thereof to the contact N20.

When the middle voltage of the low voltage is transmitted to the inverting unit 20, the transistor MP21 is turned on and thus a voltage close to the power supply voltage VDD is transmitted to the contact N20 as shown in FIG. 4B, and when the middle voltage of the high voltage is transmitted thereto, the transistor MN21 is turned on and thus a voltage close to the ground voltage GND is transmitted to the contact N20.

In an exemplary embodiment, if the middle voltage of the high voltage is larger than the input voltage VIN having the high value, the transistor MN21 turns on, even though a threshold of the transistor MN21 or a swing of the threshold thereof is high, or mobility is low. Thus, even though the input voltage VIN having the high value becomes low, it is enough to turn on the transistor MN21 and an inverted voltage of the middle voltage is transmitted to the contact N20 of the inverting unit 20. Additionally, even though variation of the threshold voltage of the transistor NM21, or the swing of the threshold thereof, or of the mobility may exist, it is enough to turn on the transistor MN21.

The output unit 30 is supplied with a voltage at the contact N20 and outputs the power supply voltage VDD or the ground voltage GND. In an exemplary embodiment, two transistors MP31 and MP32 have sources and gates connected and each other to form a current mirror.

In an exemplary embodiment, when an output of the contact N20 is close to the power supply voltage VDD, the transistor MN31 is turned on and transmits the middle voltage of the low voltage, which is the voltage at the contact N10, to the contact N30, thereby turning on the transistor MP32. Thus, the output voltage VLOG becomes the power supply voltage VDD.

In an alternative exemplary embodiment, when the output of the contact N20 is close to the ground voltage GND, the transistor MN31 is turned off, and the middle voltage of the high voltage, which is the voltage at the contact N10, is input to the gate of the transistor MN32. The ground voltage GND, which is the voltage at the contact N20, is transmitted to the output terminal OUT.

As shown in FIG. 4A, when the input voltage VIN has a low value, the output voltage VLOG becomes the power supply voltage VDD, and when the input voltage VIN has a high value, the output voltage VLOG becomes the ground voltage GND.

In an exemplary embodiment, a plurality of the transistors MP11, MN11, MP21, MN21, MP31, MP32, and MN32 may contain low temperature poly-silicon. In an alternative exemplary embodiment, the transistors MP11, MN11, MP21, MN21, MP31, MP32, and MN32 may contain amorphous silicon.

In another exemplary embodiment, the level shifter 700 does not require a separate inversion signal of the input voltage VIN, a signal line thereof is thus not necessitated. Thus, an area occupied with the level shifter 700 is reduced. Additionally, since there is no need of a separate reference voltage either, it prevents a poor operation caused by a coupling of a signal line transmitting the reference voltage and signal lines transmitting other signals.

Another exemplary embodiment of a level shifter 700 according to the present invention will now be described in detail with reference to FIGS. 5-7.

Figure 5:
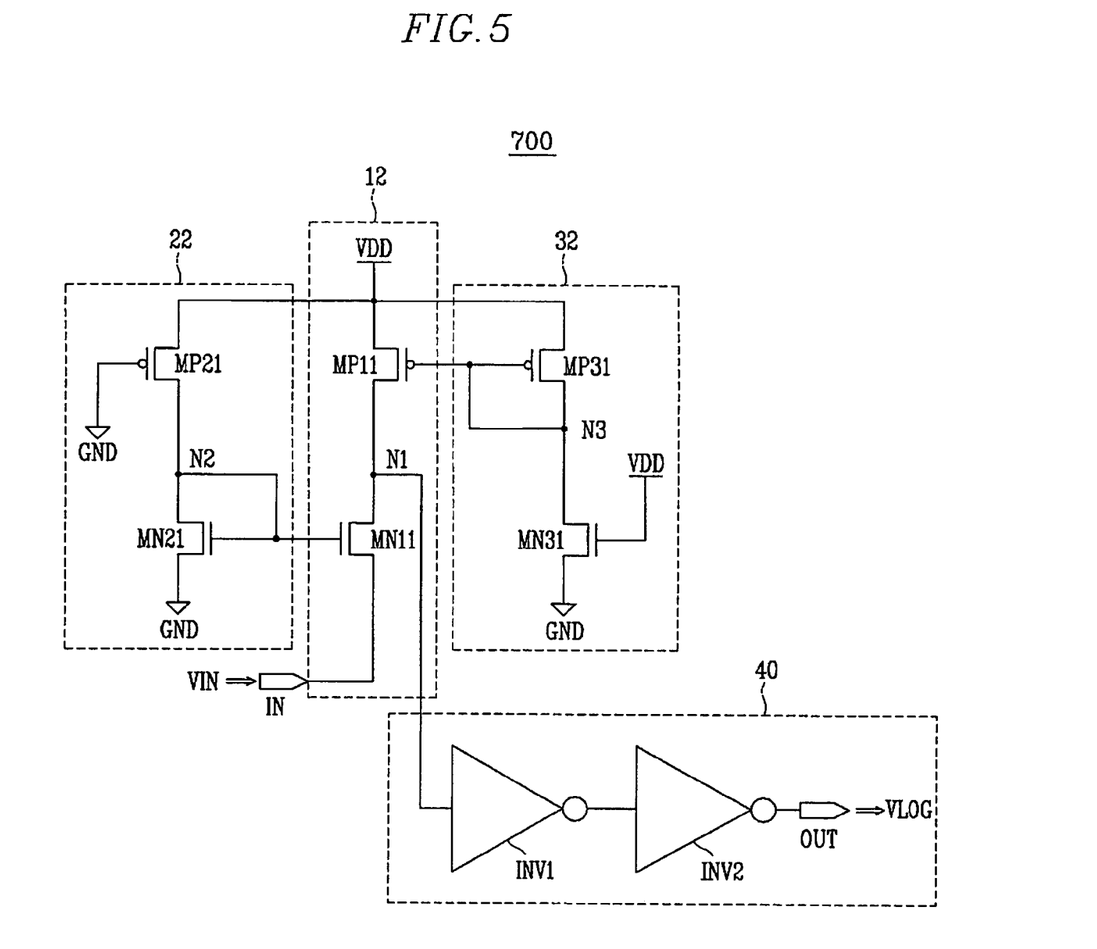
FIG. 5 is a circuit diagram of another exemplary embodiment of a level shifter according to the present invention.
Figure 6:
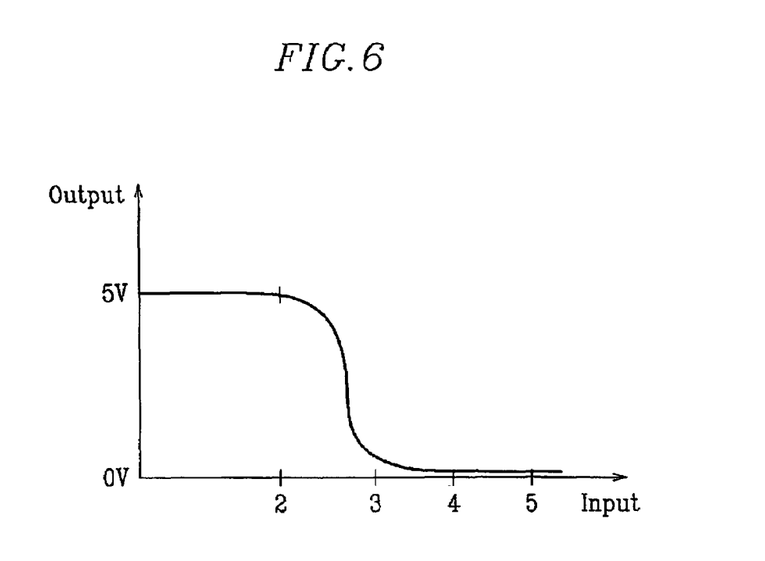
FIG. 6 shows signal waveforms of the level shifter shown in FIG. 5.
Figure 7:
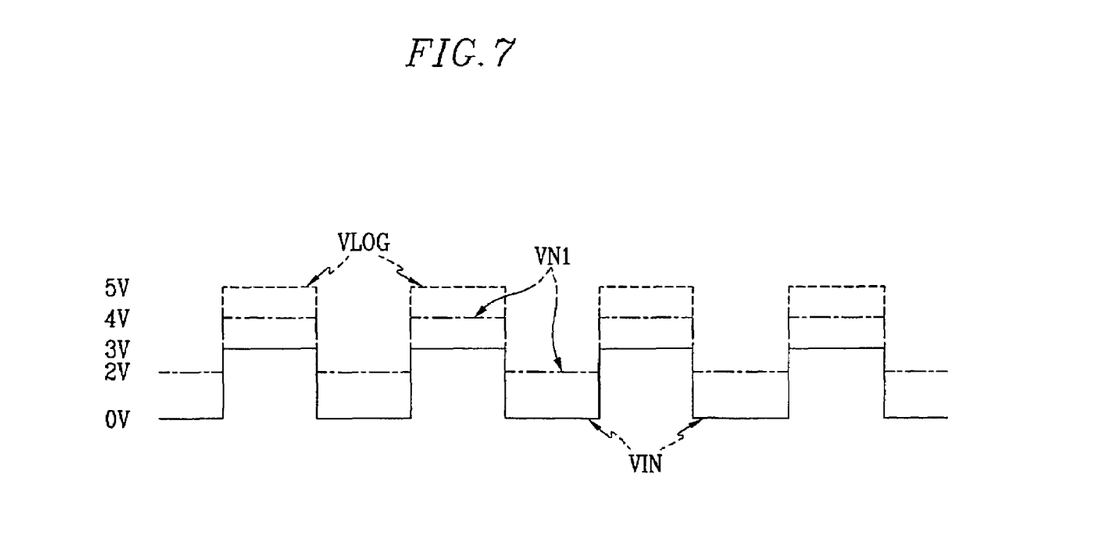
FIG. 7 is a graph to illustrate a transfer characteristic of an inverter comprising the level shifter shown in FIG. 5.

FIG. 5 is a circuit diagram of another exemplary embodiment of the level shifter 700 according to the present invention, FIG. 6 shows signal waveforms of the level shifter 700 shown in FIG. 5, and FIG. 7 is a graph to illustrate a transfer characteristic of an inverter comprising the level shifter 700 shown in FIG. 5.

Referring to FIG. 5, another exemplary embodiment of the level shifter 700 according to the present invention includes the voltage dividing unit 12, first and second voltage compensating unit 22 and 32, and an output unit 40.

In an exemplary embodiment, the voltage dividing unit 12 includes two different types of transistors, MP11 and MN11, connected between a power supply voltage VDD and an input voltage VIN as is shown in FIG. 5, and outputs a middle voltage of the power supply voltage VDD and the input voltage VIN to a point of contact N1. A gate of the transistor MP11 is connected to a point of contact N3, and a gate of the transistor MN11 is connected to a point of contact N2.

The first voltage compensating unit 22 includes two different types of transistors, MP21 and MN21, connected between the power voltage supply VDD and a ground voltage GND. A drain and a gate of the transistor MP21 are connected to the contact N2 and the ground voltage GND, respectively, and a drain and a gate of the transistor MN21 are commonly connected to the contact N2.

The second voltage compensating unit 32 includes two different types of transistors, MP31 and MN31, connected between the power supply voltage VDD and the ground voltage GND, a gate and a drain of the transistor MP31 are commonly connected to the contact N3, and a gate of the transistor MN31 is connected to the power supply voltage VDD.

The output unit 40 includes inverters INV1 and INV2 connected in series to the contact N1. The inverters INV1 and INV2 may be comprised of the inverting unit 20 shown in FIG. 3.

The operation of the level shifter 700 will now be described in further detail with reference to FIGS. 6 and 7.

In an exemplary embodiment, a low value of 0V and a high value of 3.3V for an input voltage VIN are selectively input as shown in FIG. 5, and the output unit 40 selectively outputs the output voltage VLOG of 0V and 5V.

In this embodiment, two transistors MP11 and MN11 output a voltage divided by resistances at the time of turning-on to the contact N1. The voltage at the contact N1 is 2V for the input voltage VIN having the low value, and it is 4V for the input voltage VIN having the high value, as shown in FIG. 6. When the voltage at the contact N1 is 2V an output voltage of the inverter INV1 is about 5V, and when it is inputted to the inverter INV2 the output voltage VLOG becomes about 0V. Additionally, when the voltage at the contact N1 is 4V the output voltage of the inverter INV1 is about 0V, and when it is inputted to the inverter INV2 the output voltage VLOG becomes about 5V.

As shown in FIG. 7, the output voltage VLOG is 0V for the input voltage VIN having the low value, and the output voltage VLOG is 5V for the input voltage VIN having the high value.

When a threshold voltage of the transistor MN11 is varied, the first and the second voltage compensating units 22 and 32 vary a gate-source voltage Vgs of the transistor MN11 by as much as the varied threshold voltage thereof, which will be described in detail.

In an exemplary embodiment, assume that the NMOS type transistors MN11, MN21, and MN31 each have a threshold voltage of 1V and the PMOS type transistors MP11, MP21, and MP31 each have a threshold voltage of −1V.

The transistor MN11 turns on when the gate-source voltage Vgs is more than the threshold voltage, and the transistor MP11 turns on when the gate-source voltage Vgs is less than the threshold voltage. In this case, when an absolute value is lower, there is little problem, but when the absolute value is higher, the absolute value of the gate-source voltage Vgs must also be higher by as much as such for turning on the transistors MN11 and MP11. As shown in FIG. 3, the transistors MN11 and MP11 of the voltage dividing unit 10 are connected to the constant power supply voltage VDD and the constant ground voltage GND, respectively, and thus they may not turn on when the absolute value of the threshold voltage is higher.

The transistor MP21 operates in an ohmic state and the transistor MN21 operates in a saturation state in a range of a transistor. Additionally, the transistor MP31 operates in a saturation state and the transistor MN31 operates in an ohmic state.

Current flowing into two transistors MN21 and MP31 operating in the saturation state may be represented as Equations 1.

$$I_{N21}=k(Vgs-Vt)^2/2$$

$$I_{P31}=k(Vgs-Vt)^2/2 \quad (1)$$

Where $I_{N21}$ is a current flowing into the transistor MN21, $I_{P31}$ is a current flowing into the transistor MP31, k is a transconductance, Vt is a threshold voltage, and Vgs is a gate-source voltage of each of the transistors MN21 and MP31.

Additionally, resistances and currents for two transistors MP21 and MN31 operating in the ohmic state may be linearized as follows when a drain-source voltage thereof is very small, $$R_{P21,N31}=1/[k(Vgs-Vt)] \quad (2)$$

$$I_{P21}=Vds/R_{P21}$$

$$I_{N31}=Vds/R_{N31} \quad (3)$$

where $R_{P21,N31}$ represents $R_{P21}$ and $R_{N31}$ which are respectively resistances of two transistors MP21 and MN31 operating in the ohmic state, and $I_{P31}$ and $I_{N31}$ are current flowing into two transistors MP21 and MN31, respectively.

In an exemplary embodiment, when the threshold voltage of the transistor MN11 is varied from 1V to 2V, the threshold voltages of other transistors (e.g. MN21) formed by the same manufacturing process as the transistor MN11 are also varied to 2V. Two transistors MP21 and MN21 of the first voltage compensating unit 22 are connected in series with each other and the current from the transistor MN21 is inputted to the transistor MN21. Thus the current flowing to the two transistors MP21 and MN21 is identical and can be represented as:

$$I_{P21}=I_{N21}=k(Vgs-Vt)^2/2 \quad (4)$$

Since the threshold voltages are varied from 1V to 2V, the gate-source voltage is also required to be larger by an incremental amount in order to output the same voltage as the previous one. The gate of the transistor MN21 is connected to the gate of the transistor MN11 and the source of the transistor MN21 is connected the ground voltage GND of 0V, and thus the gate voltage of the transistor MN11 becomes larger by the incremental amount. For example, when the gate voltage of the transistor NM11 was 5V, it becomes 6V.

Likewise, when the threshold voltage of the transistor MP11 is varied from −1V to −2V, the absolute value of the gate-source voltage is larger, that is, the gate voltage of the transistor MP11 is lower. For example, when the gate voltage of thereof was −5V, it becomes −6V.

As described above, in the embodiments of the present invention there is no need for a separate signal line transmitting an inverted signal of the input voltage VIN, thereby reducing an area occupied by the level shifter.

Additionally, when the threshold voltages of the transistors MP11 and MN1 are varied, the voltage compensating units 22 and 32 are provided on both sides of the voltage dividing unit 12 to vary the gate voltages of the transistors MP11 and MN11 in synchronization with the variation, thereby preventing a poor operation thereof. Thus, a reliable level shifter can be provided.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. A level shifter comprising:
    a voltage dividing unit receiving a first voltage and an input voltage and generating a middle voltage of the first voltage and the input voltage;
    first and second voltage compensating units connected to the voltage dividing unit and connected between the first voltage and a second voltage, the first and second voltage compensating units compensating a voltage variation of the voltage dividing unit; and
    an output unit receiving an output from the voltage dividing unit and outputting an output voltage,
    wherein the voltage dividing unit comprises:
        a first transistor having a first terminal connected to the first voltage, a second terminal connected to the second voltage compensating unit, and a third terminal connected to a first contact connected to the output unit; and
        a second transistor having a first terminal connected to the first contact, a second terminal connected to the first voltage compensating unit, and a third terminal connected to the input voltage.

2. The level shifter of claim 1, wherein the first voltage compensating unit comprises:
    a third transistor having a first terminal connected to the first voltage, a second terminal connected to the second voltage, and a third terminal connected to a second contact connected to the second terminal of the second transistor; and
    a fourth transistor having first and second terminals commonly connected to the second contact, and a third terminal connected to the second voltage.

3. The level shifter of claim 2, wherein the second voltage compensating unit comprises:
    fifth transistor having a first terminal connected to the first voltage, and second and third terminals commonly connected to a third contact connected to the second terminal of the first transistor; and a sixth transistor having a first terminal connected to the third contact, a second terminal connected to the first voltage, and a third terminal connected to the second voltage.

4. The level shifter of claim 3, wherein the output unit comprises first and second inverters connected in series between the first contact and an output terminal outputting the output voltage.

5. The level shifter of claim 4, wherein the third transistor operates in an ohmic state and the fourth transistor operates in a saturation state.

6. The level shifter of claim 5, wherein the fifth transistor operates in a saturation state and the sixth transistor operates in an ohmic state.

7. The level shifter of claim 6, wherein, when a threshold voltage of the first transistor is varied, the first voltage compensating unit varies a voltages at the second terminal of the first transistor by as much as a variation amount of the threshold voltage of the first transistor.

8. The level shifter of claim 6, wherein, when a threshold voltage of the second transistor is varied, the second voltage compensating unit varies a voltages at the second terminal of the second transistor by as much as a variation amount of the threshold voltage of the second transistor.

9. The level shifter of claim 6, wherein the first, the second, the third, the fourth, the fifth, and the sixth transistors contain low temperature poly-silicon.

10. The level shifter of claim 6, wherein the first, the third, and the fifth transistors are PMOS types, and the second, the fourth, and the sixth transistors are NMOS types.

11. The level shifter of claim 1, wherein the first voltage is a power supply voltage and the second voltage is a ground voltage.

12. A display device comprising a level shifter amplifying a predetermined voltage for output, a gate driver and a data driver operating in response to the output from the level shifter, and a signal controller controlling the gate driver and the data driver, wherein the level shifter comprises:

a voltage dividing unit receiving a first voltage and an input voltage and generating a middle voltage of the first voltage and the input voltage;

first and second voltage compensating units connected to the voltage dividing unit and connected between the first voltage and a second voltage, the first and second voltage compensating units compensating a voltage variation of the voltage dividing unit; and an output unit receiving an output from the voltage dividing unit and outputting an output voltage, wherein the voltage dividing unit comprises:

a first transistor having a first terminal connected to the first voltage, a second terminal connected to the second voltage compensating unit, and a third terminal connected to a first contact connected to the output unit; and a second transistor having a first terminal connected to the first contact, a second terminal connected to the first voltage compensating unit, and a third terminal connected to the input voltage.

13. The display device of claim 12, wherein the first voltage compensating unit comprises:

a third transistor having a first terminal connected to the first voltage, a second terminal connected to the second voltage, and a third terminal connected to a second contact connected to the second terminal of the second transistor; and a fourth transistor having first and second terminals commonly connected to the second contact, and a third terminal connected to the second voltage, and the second voltage compensating unit comprises:

a fifth transistor having a first terminal connected to the first voltage, and second and third terminals commonly connected to a third contact connected to the second terminal of the first transistor; and a sixth transistor having a first terminal connected to the third contact, a second terminal connected to the first voltage, and a third terminal connected to the second voltage.

14. The display device of claim 13, wherein the output unit comprises first and second inverters connected in series between the first contact and an output terminal outputting the output voltage.

15. The display device of claim 13, wherein the third transistor operates in an ohmic state and the fourth transistor operates in a saturation state.

16. The display device of claim 13, wherein the fifth transistor operates in a saturation state and the sixth transistor operates in an ohmic state.

17. The display device of claim 13, wherein, when threshold voltages of the first and the second transistors are varied, the first and the second voltage compensating units vary voltages at the second terminals of the first and the second transistors by as much as variation amounts of the threshold voltages, respectively.

18. The display device of claim 17, wherein the first voltage is a power supply voltage and the second voltage is a ground voltage.

19. The display device of claim 17, wherein the first, the second, the third, the fourth, the fifth, and the sixth transistors contains low temperature poly-silicon.

20. The display device of claim 17, wherein the first, the third, and the fifth transistors are PMOS types, and the second, the fourth, and the sixth transistors are NMOS types.

21. The display device of claim 12, wherein the level shifter is integrated in the display device.

\* \* \* \* \*